(12) United States Patent
Fleischmann et al.

(10) Patent No.: US 7,712,933 B2
(45) Date of Patent: May 11, 2010

(54) LIGHT FOR VEHICLES

(75) Inventors: Eric L. Fleischmann, Holland, MI (US); Nick J. DeVries, Holland, MI (US); Thomas J. Veenstra, Zeeland, MI (US); Michael K. Judge, Livonia, MI (US)

(73) Assignee: InterLum, LLC, Livonia, MI (US)

( * ) Notice: Subject to any disclaimer, the term of this patent is extended or adjusted under 35 U.S.C. 154(b) by 224 days.

(21) Appl. No.: 12/051,512

(22) Filed: Mar. 19, 2008

(65) Prior Publication Data

US 2008/0253140 A1    Oct. 16, 2008

Related U.S. Application Data

(60) Provisional application No. 60/895,609, filed on Mar. 19, 2007.

(51) Int. Cl.
*F21V 9/00* (2006.01)

(52) U.S. Cl. .................. 362/511; 362/495; 362/496

(58) Field of Classification Search .......... 362/495, 362/496, 511, 555, 565
See application file for complete search history.

(56) References Cited

U.S. PATENT DOCUMENTS

| | | | |
|---|---|---|---|
| 1,515,717 A | 11/1924 | Ayotte | |
| 3,456,043 A | 7/1969 | Emery | |
| 3,541,488 A | 11/1970 | Odson | |
| 4,041,301 A | 8/1977 | Pelchat | |
| 4,173,035 A | 10/1979 | Hoyt | |
| 4,211,955 A | 7/1980 | Ray | |
| 4,267,559 A | 5/1981 | Johnson et al. | |
| 4,277,819 A | 7/1981 | Sobota et al. | |
| 4,453,903 A | 6/1984 | Pukaite | |
| 4,544,991 A | 10/1985 | Gorsuch | |
| 4,645,970 A | 2/1987 | Murphy | |
| 4,733,335 A | 3/1988 | Serizawa et al. | |
| 4,744,011 A | 5/1988 | Tomita et al. | |
| 4,764,645 A | 8/1988 | Takasawa | |
| 4,788,630 A | 11/1988 | Gavagan | |
| 4,794,431 A | 12/1988 | Park | |
| 4,819,136 A | 4/1989 | Ramsey | |
| 4,857,483 A | 8/1989 | Steffen et al. | |
| 4,860,436 A | 8/1989 | Hirabayashi et al. | |
| 4,885,663 A | 12/1989 | Parker | |

(Continued)

FOREIGN PATENT DOCUMENTS

DE    39 16 875 A1    12/1990

(Continued)

OTHER PUBLICATIONS

International Search Report, International Application No. PCT/US2008/076859, filed Sep. 18, 2008.

*Primary Examiner*—David V Bruce
(74) *Attorney, Agent, or Firm*—Price, Heneveld, Cooper, DeWitt & Litton, LLP

(57) ABSTRACT

A light for motor vehicles and the like includes one or more LEDs that are embedded in a polymer material. The light may be positioned on an exposed surface of the vehicle, and the encapsulation of the LEDs and other electrical components provides a waterproof assembly that is substantially impervious to ambient conditions. The light may include a light source and a light guide that are disposed in a watertight housing.

46 Claims, 8 Drawing Sheets

U.S. PATENT DOCUMENTS

| | | |
|---|---|---|
| 4,886,960 A | 12/1989 | Molyneux et al. |
| 4,897,771 A | 1/1990 | Parker |
| 4,907,132 A | 3/1990 | Parker |
| 4,935,665 A | 6/1990 | Murata |
| 4,948,242 A | 8/1990 | Desmond et al. |
| 4,954,308 A | 9/1990 | Yabe et al. |
| 4,965,933 A | 10/1990 | Mraz et al. |
| 4,965,950 A | 10/1990 | Yamada |
| 4,985,810 A | 1/1991 | Ramsey |
| 5,036,248 A | 7/1991 | McEwan et al. |
| 5,038,255 A | 8/1991 | Nishihashi et al. |
| 5,070,219 A | 12/1991 | Grosskrueger et al. |
| 5,119,174 A | 6/1992 | Chen |
| 5,136,483 A | 8/1992 | Schoniger et al. |
| 5,160,200 A | 11/1992 | Cheselske |
| 5,160,201 A | 11/1992 | Wrobel |
| 5,161,872 A | 11/1992 | Sasaki et al. |
| 5,178,448 A | 1/1993 | Adams et al. |
| 5,182,032 A | 1/1993 | Dickie et al. |
| 5,193,895 A | 3/1993 | Naruke et al. |
| 5,203,060 A | 4/1993 | Mraz et al. |
| 5,228,223 A | 7/1993 | Lan |
| 5,236,374 A | 8/1993 | Leonard et al. |
| 5,239,406 A | 8/1993 | Lynam |
| 5,241,457 A | 8/1993 | Sasajima |
| 5,249,104 A | 9/1993 | Mizobe |
| 5,285,060 A | 2/1994 | Larson et al. |
| 5,297,010 A | 3/1994 | Camarota et al. |
| 5,313,729 A | 5/1994 | Sakai et al. |
| 5,325,271 A | 6/1994 | Hutchisson |
| 5,325,275 A | 6/1994 | Liu |
| 5,334,539 A | 8/1994 | Shinar et al. |
| 5,337,225 A | 8/1994 | Brookman |
| 5,355,245 A | 10/1994 | Lynam |
| 5,371,659 A | 12/1994 | Pastrick et al. |
| 5,382,811 A | 1/1995 | Takahashi |
| 5,404,282 A | 4/1995 | Klinke et al. |
| 5,430,627 A | 7/1995 | Nagano |
| 5,463,280 A | 10/1995 | Johnson |
| 5,497,305 A | 3/1996 | Pastrick et al. |
| 5,497,306 A | 3/1996 | Pastrick |
| 5,499,170 A | 3/1996 | Gagne |
| 5,530,240 A | 6/1996 | Larson et al. |
| 5,563,422 A | 10/1996 | Nakamura et al. |
| 5,567,036 A | 10/1996 | Theobald et al. |
| 5,568,964 A | 10/1996 | Parker et al. |
| 5,572,812 A | 11/1996 | Mastuoka |
| 5,578,839 A | 11/1996 | Nakamura et al. |
| 5,613,751 A | 3/1997 | Parker et al. |
| 5,618,096 A | 4/1997 | Parker et al. |
| 5,632,551 A | 5/1997 | Roney et al. |
| 5,641,221 A | 6/1997 | Schindele et al. |
| 5,649,756 A | 7/1997 | Adams et al. |
| 5,652,434 A | 7/1997 | Nakamura et al. |
| 5,669,698 A | 9/1997 | Veldman et al. |
| 5,669,699 A | 9/1997 | Pastrick et al. |
| 5,669,704 A | 9/1997 | Pastrick |
| 5,671,996 A | 9/1997 | Bos et al. |
| 5,673,994 A | 10/1997 | Fant, Jr. et al. |
| 5,680,245 A | 10/1997 | Lynam |
| 5,708,428 A | 1/1998 | Phillips |
| 5,734,182 A | 3/1998 | Nakamura et al. |
| 5,746,497 A | 5/1998 | Machida |
| 5,747,832 A | 5/1998 | Nakamura et al. |
| 5,752,766 A | 5/1998 | Bailey et al. |
| 5,765,940 A | 6/1998 | Levy et al. |
| 5,786,665 A | 7/1998 | Ohtsuki et al. |
| 5,803,579 A | 9/1998 | Turnbull et al. |
| 5,806,965 A | 9/1998 | Deese |
| 5,848,837 A | 12/1998 | Gustafson |
| 5,868,116 A | 2/1999 | Betts et al. |
| 5,876,107 A | 3/1999 | Parker et al. |
| 5,877,558 A | 3/1999 | Nakamura et al. |
| 5,880,486 A | 3/1999 | Nakamura et al. |
| 5,894,686 A | 4/1999 | Parker et al. |
| 5,895,115 A | 4/1999 | Parker et al. |
| 5,909,037 A | 6/1999 | Rajkomar et al. |
| 5,915,830 A | 6/1999 | Dickson et al. |
| 5,921,652 A | 7/1999 | Parker et al. |
| 5,921,660 A | 7/1999 | Yu |
| 5,927,845 A | 7/1999 | Gustafson et al. |
| 5,934,798 A | 8/1999 | Roller et al. |
| 5,938,321 A | 8/1999 | Bos et al. |
| 5,944,414 A | 8/1999 | Nishitani et al. |
| 5,947,588 A | 9/1999 | Huang |
| 5,998,925 A | 12/1999 | Shimizu et al. |
| 6,005,210 A | 12/1999 | Chien |
| 6,030,089 A | 2/2000 | Parker et al. |
| 6,045,240 A | 4/2000 | Hochstein |
| 6,070,998 A | 6/2000 | Jennings et al. |
| 6,079,838 A | 6/2000 | Parker et al. |
| 6,082,870 A | 7/2000 | George |
| 6,097,501 A | 8/2000 | Hayashi et al. |
| 6,113,247 A | 9/2000 | Adams et al. |
| 6,113,248 A | 9/2000 | Mistopoulos et al. |
| 6,139,172 A | 10/2000 | Bos et al. |
| 6,152,575 A | 11/2000 | Montanino |
| 6,152,590 A | 11/2000 | Furst et al. |
| 6,158,867 A | 12/2000 | Parker et al. |
| 6,158,882 A | 12/2000 | Bischoff, Jr. |
| 6,162,381 A | 12/2000 | Onishi et al. |
| 6,164,805 A | 12/2000 | Hulse |
| 6,190,026 B1 | 2/2001 | Moore |
| 6,204,512 B1 | 3/2001 | Nakamura et al. |
| 6,215,133 B1 | 4/2001 | Nakamura et al. |
| 6,220,722 B1 | 4/2001 | Begemann |
| 6,234,648 B1 | 5/2001 | Borner et al. |
| 6,244,734 B1 | 6/2001 | Hulse |
| 6,255,613 B1 | 7/2001 | Yang |
| 6,276,822 B1 | 8/2001 | Bedrosian et al. |
| 6,283,612 B1 | 9/2001 | Hunter |
| 6,347,880 B1 | 2/2002 | Furst et al. |
| 6,347,881 B1 | 2/2002 | Serizawa et al. |
| 6,357,902 B1 | 3/2002 | Horowitz |
| 6,371,636 B1 | 4/2002 | Wesson |
| 6,402,570 B2 | 6/2002 | Soga et al. |
| 6,404,131 B1 | 6/2002 | Kawano et al. |
| 6,412,973 B1 | 7/2002 | Bos et al. |
| 6,419,306 B2 | 7/2002 | Sano et al. |
| 6,469,323 B1 | 10/2002 | Nakamura et al. |
| 6,483,623 B1 | 11/2002 | Maruyama |
| 6,531,328 B1 | 3/2003 | Chen |
| 6,580,228 B1 | 6/2003 | Chen et al. |
| 6,583,550 B2 | 6/2003 | Iwasa et al. |
| 6,595,671 B2 | 7/2003 | Lefebvre et al. |
| 6,598,996 B1 | 7/2003 | Lodhie |
| 6,604,834 B2 | 8/2003 | Kalana |
| 6,616,313 B2 | 9/2003 | Furst et al. |
| 6,617,786 B1 | 9/2003 | Centofante |
| 6,659,632 B2 | 12/2003 | Chen |
| 6,669,267 B1 | 12/2003 | Lynham et al. |
| 6,673,292 B1 | 1/2004 | Gustafson et al. |
| 6,682,331 B1 | 1/2004 | Peh et al. |
| 6,709,132 B2 | 3/2004 | Ishibashi |
| 6,709,137 B1 | 3/2004 | Glovak et al. |
| 6,726,502 B2 | 4/2004 | Hayes |
| 6,729,055 B2 | 5/2004 | Chou |
| 6,739,733 B1 | 5/2004 | Lamke et al. |
| 6,739,744 B2 | 5/2004 | Williams et al. |
| 6,755,547 B2 | 6/2004 | Parker |
| 6,757,969 B1 | 7/2004 | Chan |
| 6,786,625 B2 | 9/2004 | Wesson |
| 6,793,374 B2 | 9/2004 | Begemann |
| 6,812,481 B2 | 11/2004 | Matsumura et al. |

| | | | | | | |
|---|---|---|---|---|---|---|
| 6,814,474 B2 | 11/2004 | Groeller | | 2005/0121829 A1 | 6/2005 | Spurr et al. |
| 6,848,818 B2 | 2/2005 | Huizenga | | 2005/0200045 A1 | 9/2005 | Hunkeler |
| 6,860,628 B2 | 3/2005 | Robertson et al. | | 2005/0206040 A1 | 9/2005 | Mercado |
| 6,866,394 B1 | 3/2005 | Hutchins et al. | | 2005/0207176 A1 | 9/2005 | Johnson et al. |
| 6,874,925 B2 | 4/2005 | Page et al. | | 2005/0210672 A1 | 9/2005 | Reynolds et al. |
| 6,889,456 B2 | 5/2005 | Shibata et al. | | 2005/0213351 A1 | 9/2005 | Yang |
| 6,899,449 B2 | 5/2005 | Hatagishi et al. | | 2005/0214968 A1 | 9/2005 | Waitl et al. |
| 6,907,643 B2 | 6/2005 | Koops et al. | | 2005/0269587 A1 | 12/2005 | Loh et al. |
| 6,910,783 B2 | 6/2005 | Mezei et al. | | 2005/0286840 A1 | 12/2005 | Ho et al. |
| 6,921,926 B2 | 7/2005 | Hsu | | 2006/0040094 A1 | 2/2006 | Mizuno et al. |
| 6,930,332 B2 | 8/2005 | Hashimoto et al. | | 2006/0043607 A1 | 3/2006 | Matsuura et al. |
| 6,942,360 B2 | 9/2005 | Chou et al. | | 2006/0157725 A1 | 7/2006 | Flaherty |
| 6,949,709 B1 | 9/2005 | Barat et al. | | 2006/0187652 A1 | 8/2006 | Doyle |
| 6,971,758 B2 | 12/2005 | Inui et al. | | 2006/0198155 A1 | 9/2006 | Nickola et al. |
| 6,979,100 B2 | 12/2005 | Reiff et al. | | 2006/0215422 A1 | 9/2006 | Laizure, Jr. et al. |
| 6,982,518 B2 | 1/2006 | Chou et al. | | 2006/0220049 A1 | 10/2006 | Flaherty et al. |
| 6,988,819 B2 | 1/2006 | Siktberg et al. | | 2006/0239037 A1 | 10/2006 | Repetto et al. |
| 6,997,576 B1 | 2/2006 | Lodhie et al. | | 2006/0245188 A1 | 11/2006 | Takenaka |
| 7,040,779 B2 | 5/2006 | Lamke et al. | | 2006/0245191 A1 | 11/2006 | Ratcliffe |
| 7,048,423 B2 | 5/2006 | Stepanenko et al. | | 2007/0075451 A1 | 4/2007 | Winter et al. |
| 7,055,997 B2 | 6/2006 | Baek | | 2007/0080357 A1 | 4/2007 | Ishii |
| 7,070,304 B2 | 7/2006 | Imai | | 2007/0097683 A1 | 5/2007 | Chikugawa |
| 7,071,523 B2 | 7/2006 | Yano et al. | | 2007/0103901 A1 | 5/2007 | Reid |
| 7,080,446 B2 | 7/2006 | Baba et al. | | 2007/0103902 A1 | 5/2007 | Hsiao |
| 7,081,644 B2 | 7/2006 | Flaherty et al. | | 2007/0121326 A1 | 5/2007 | Nall et al. |
| 7,083,311 B2 | 8/2006 | Schreck et al. | | 2007/0133214 A1 | 6/2007 | Maeda et al. |
| 7,086,756 B2 | 8/2006 | Maxik | | 2007/0153503 A1 | 7/2007 | Feng |
| 7,102,213 B2 | 9/2006 | Sorg | | 2007/0153549 A1 | 7/2007 | Parker |
| 7,114,830 B2 | 10/2006 | Robertson et al. | | 2007/0166866 A1 | 7/2007 | Appelt et al. |
| 7,119,422 B2 | 10/2006 | Chin | | 2007/0170454 A1 | 7/2007 | Andrews |
| 7,128,442 B2 | 10/2006 | Lee et al. | | 2007/0187710 A1 | 8/2007 | Steen et al. |
| 7,140,751 B2 | 11/2006 | Lin | | 2007/0194333 A1 | 8/2007 | Son |
| 7,160,015 B2 | 1/2007 | Parker | | 2007/0194336 A1 | 8/2007 | Shin et al. |
| 7,172,314 B2 | 2/2007 | Currie et al. | | 2007/0194337 A1 | 8/2007 | Kondo |
| 7,175,324 B2 | 2/2007 | Kwon | | 2007/0196762 A1 | 8/2007 | Maeda et al. |
| 7,195,381 B2 | 3/2007 | Lynam et al. | | 2007/0200127 A1 | 8/2007 | Andrews et al. |
| 7,199,438 B2 | 4/2007 | Appelt et al. | | 2007/0205425 A1 | 9/2007 | Harada |
| 7,213,952 B2 | 5/2007 | Iwai | | 2007/0217192 A1 | 9/2007 | Hiratsuka |
| 7,220,029 B2 | 5/2007 | Bynum | | 2007/0241357 A1 | 10/2007 | Yan |
| 7,224,001 B2 | 5/2007 | Cao | | 2007/0241362 A1 | 10/2007 | Han et al. |
| 7,226,189 B2 | 6/2007 | Lee et al. | | 2007/0257398 A1 | 11/2007 | Moncrieff |
| 7,249,869 B2 | 7/2007 | Takahashi et al. | | 2007/0259576 A1 | 11/2007 | Brandt et al. |
| 7,268,368 B1 | 9/2007 | Knapp | | 2007/0274648 A1 | 11/2007 | Ip |
| 7,280,288 B2 | 10/2007 | Loh et al. | | 2008/0066355 A1 | 3/2008 | Misawa et al. |
| 7,282,785 B2 | 10/2007 | Yoshida | | 2008/0106187 A1 | 5/2008 | Suzuki et al. |
| 7,301,176 B2 | 11/2007 | Abe et al. | | 2008/0170405 A1 | 7/2008 | Kamiya et al. |
| 7,374,305 B2 | 5/2008 | Parker | | 2008/0259642 A1 | 10/2008 | Parker |
| 7,384,177 B2 | 6/2008 | Parker | | | | |
| 7,387,420 B2 | 6/2008 | Ogino et al. | | | | |
| 7,434,974 B2 | 10/2008 | Parker | | | | |
| 7,467,887 B2 | 12/2008 | Parker | | | | |

FOREIGN PATENT DOCUMENTS

| | | |
|---|---|---|
| DE | 298 11 417 A1 | 10/1998 |
| DE | 198 05 771 A1 | 8/1999 |
| JP | 63292690 | 11/1988 |
| JP | 2058892 | 2/1990 |
| JP | 11220239 | 8/1999 |
| JP | 2002096680 | 4/2002 |
| JP | 2002287671 | 10/2002 |
| JP | 2005134789 | 5/2005 |
| JP | 2005221661 | 8/2005 |
| JP | 2006062431 | 3/2006 |
| JP | 2008070697 | 3/2008 |
| WO | 97/48134 | 12/1997 |
| WO | 97/50132 | 12/1997 |
| WO | 00/55685 | 9/2000 |
| WO | 00/55914 | 9/2000 |
| WO | WO 2008/024761 A2 | 2/2008 |

| | | |
|---|---|---|
| 2002/0003700 A1 | 1/2002 | Selkee |
| 2002/0004251 A1 | 1/2002 | Roberts et al. |
| 2002/0089849 A1 | 7/2002 | Lamke et al. |
| 2002/0105812 A1 | 8/2002 | Zimmermann et al. |
| 2003/0160256 A1 | 8/2003 | Durocher et al. |
| 2004/0056265 A1 | 3/2004 | Arndt et al. |
| 2004/0114367 A1 | 6/2004 | Li |
| 2004/0180459 A1 | 9/2004 | Hsu |
| 2004/0223328 A1 | 11/2004 | Lee et al. |
| 2004/0252501 A1 | 12/2004 | Moriyama et al. |
| 2004/0265512 A1 | 12/2004 | Aengenheyster et al. |
| 2005/0012880 A1 | 1/2005 | Yoshii et al. |
| 2005/0032259 A1 | 2/2005 | Nakajima et al. |
| 2005/0117352 A1 | 6/2005 | Lin |

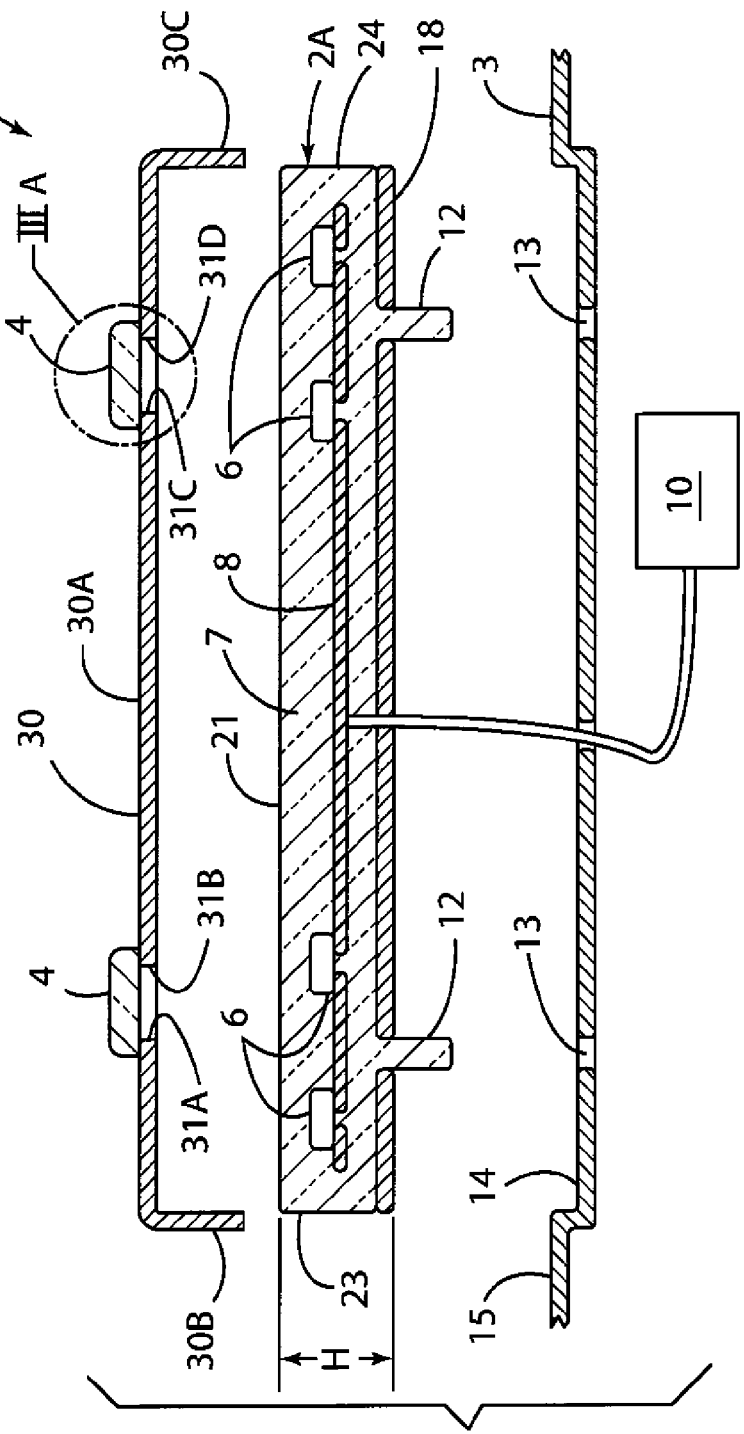

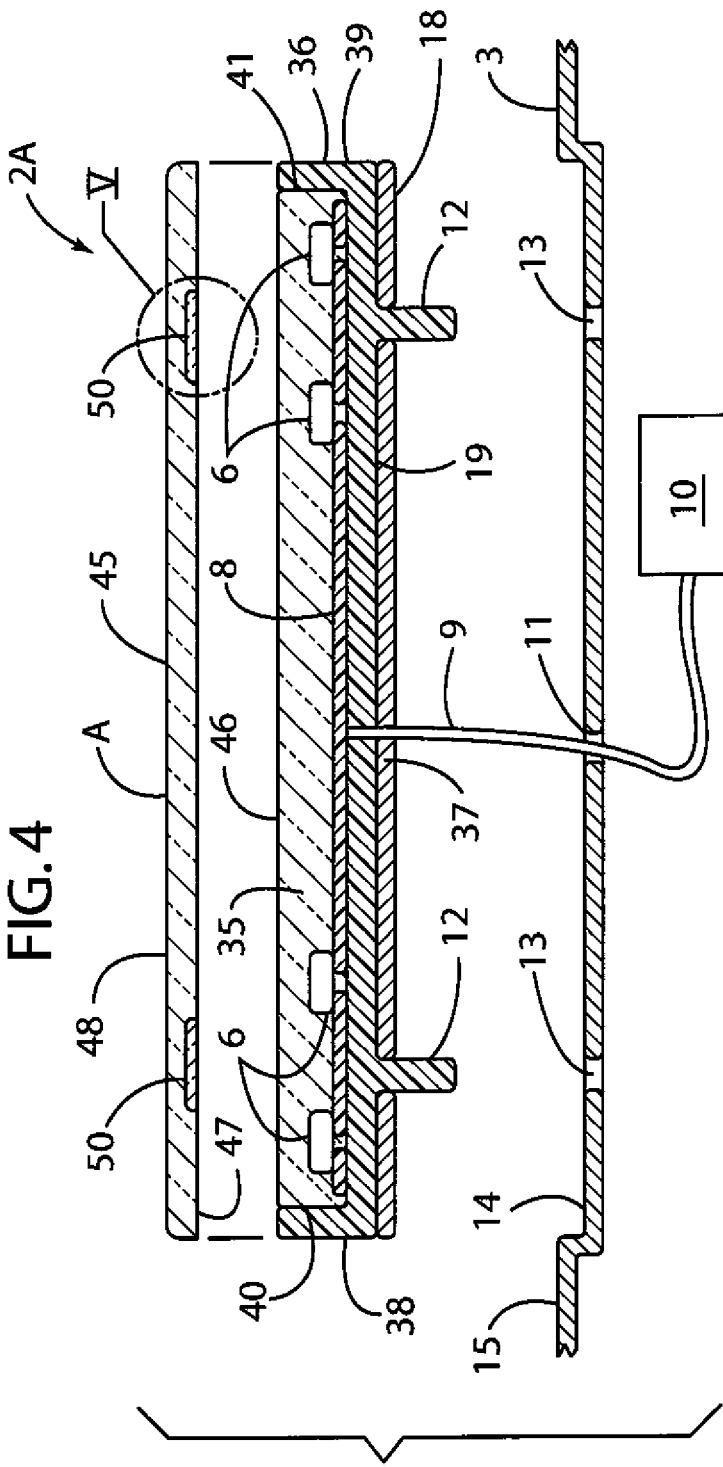

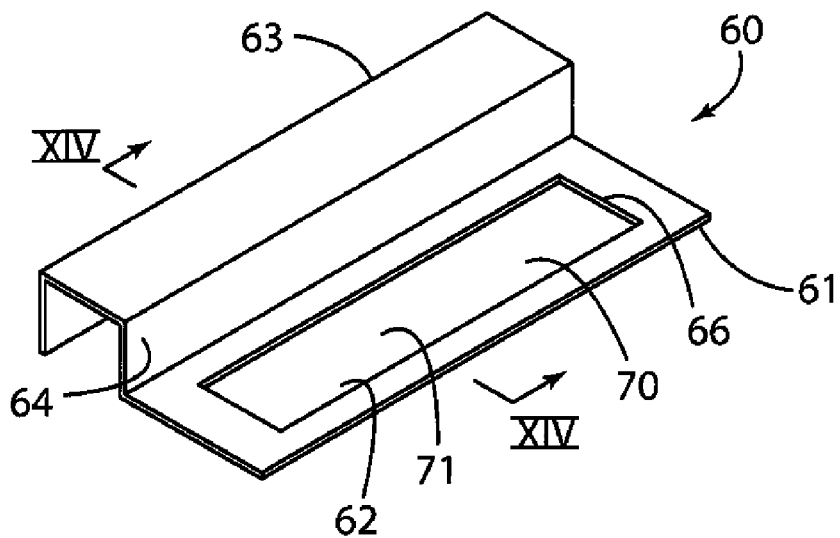
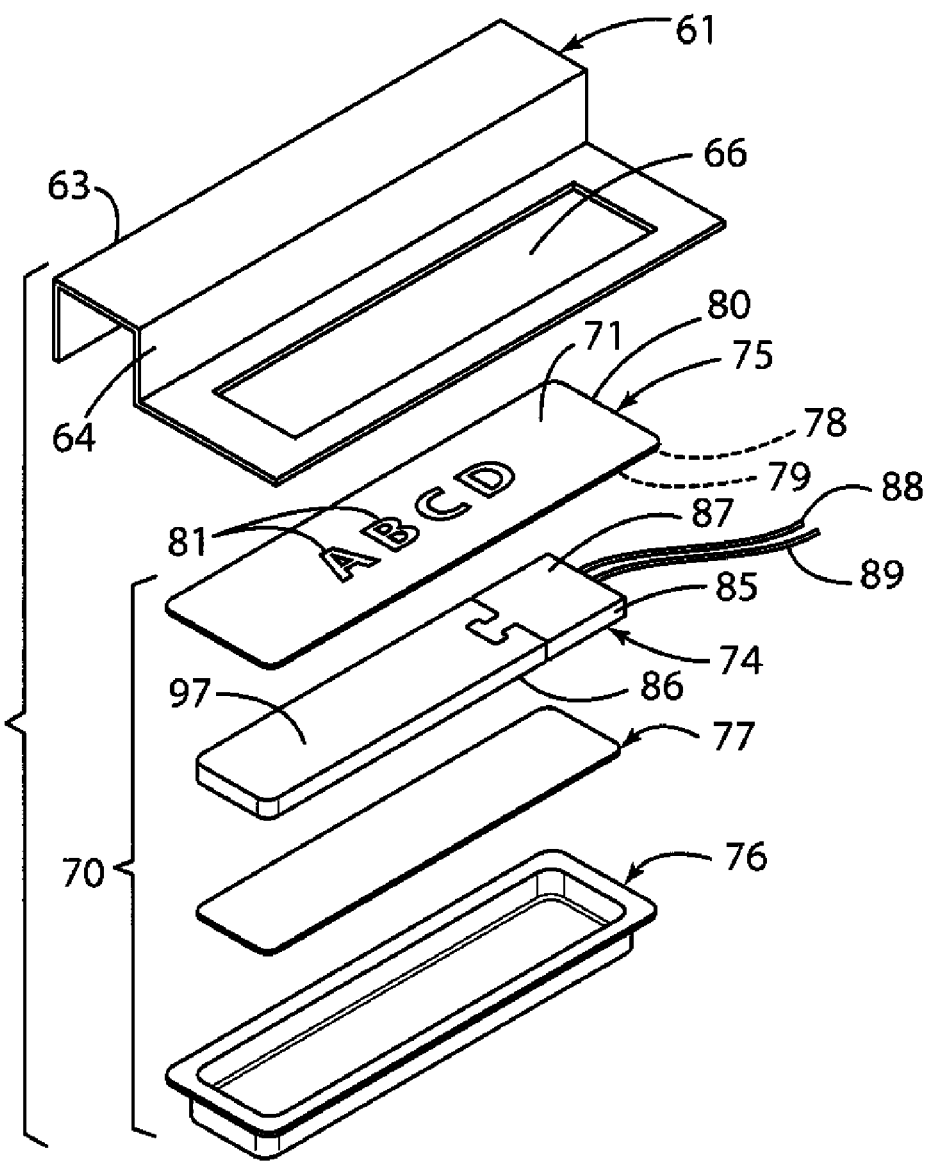

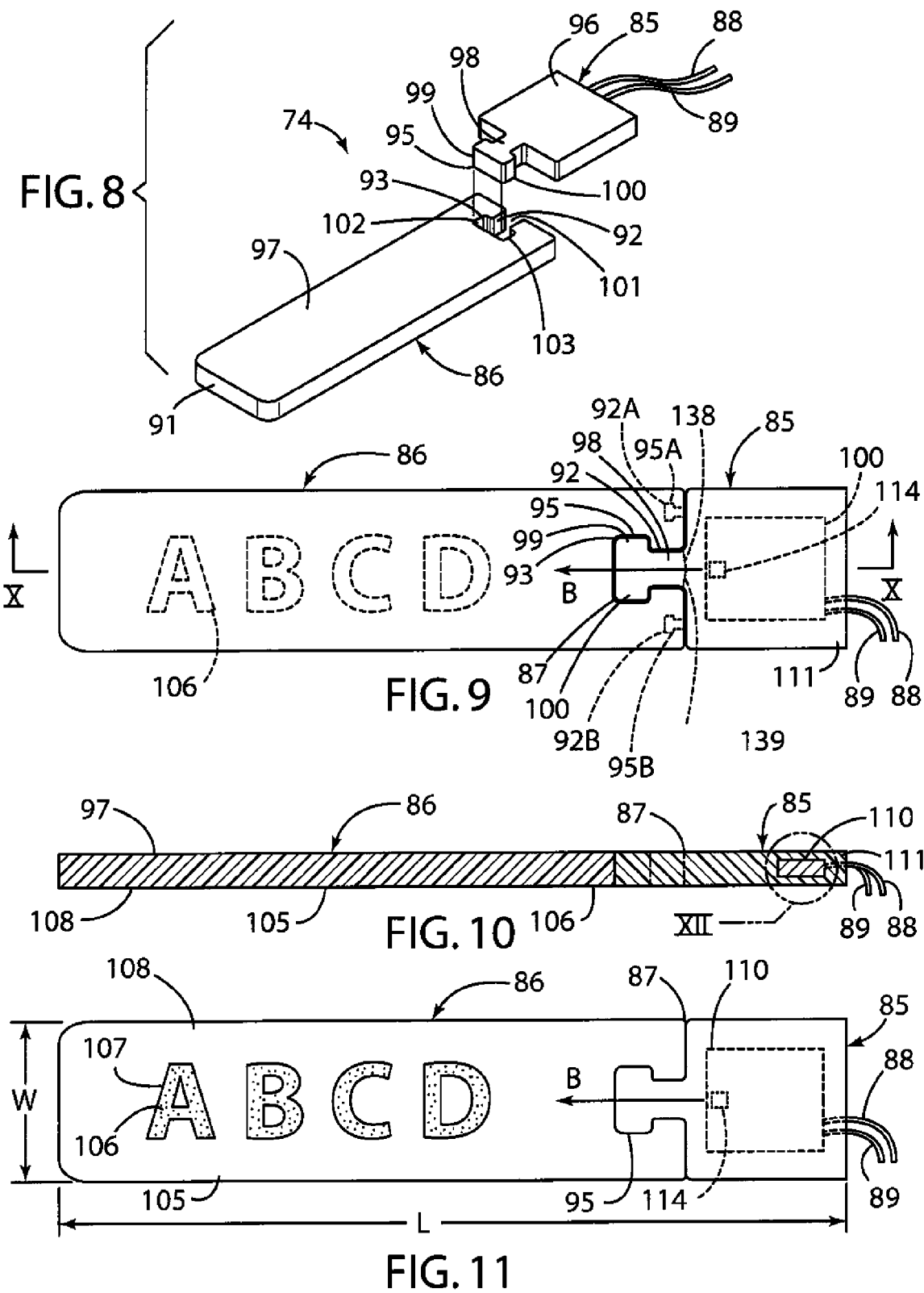

LIGHT FOR VEHICLES

CROSS-REFERENCE TO RELATED APPLICATIONS

This application claims the benefit of U.S. Provisional Application No. 60/895,609, filed on Mar. 19, 2007, entitled LIGHTED BADGE OR EMBLEM, the entire contents of which are incorporated herein by reference.

BRIEF DESCRIPTION OF THE DRAWINGS

FIG. 1;

FIG. 3 is a partially exploded, fragmentary, cross-sectional view of a badge or emblem according to another aspect of the present invention;

FIG. 3A is an enlarged view of a portion of the badge or emblem of FIG. 3;

FIG. 4 is a partially exploded, fragmentary, cross-sectional view of a badge or emblem according to yet another aspect of the present invention;

FIG. 5 is an enlarged fragmentary view of a portion of the badge or emblem of FIG. 4;

FIG. 6 is a isometric view of a light assembly and doorsill according to another aspect of the present invention;

FIG. 7 is an exploded isometric view of the lighted doorsill assembly of FIG. 6;

FIG. 8 is an exploded isometric view of the light guide and light source of FIG. 7;

FIG. 9 is a top plan view of the light guide and light source assembly of FIG. 8;

FIG. 10 is a cross-sectional view of the light guide and light source assembly of FIG. 9, taken along the line X-X;

FIG. 11 is a bottom plan view of the light guide and light source assembly of FIG. 10;

DETAILED DESCRIPTION OF PREFERRED EMBODIMENT

Figure 2:
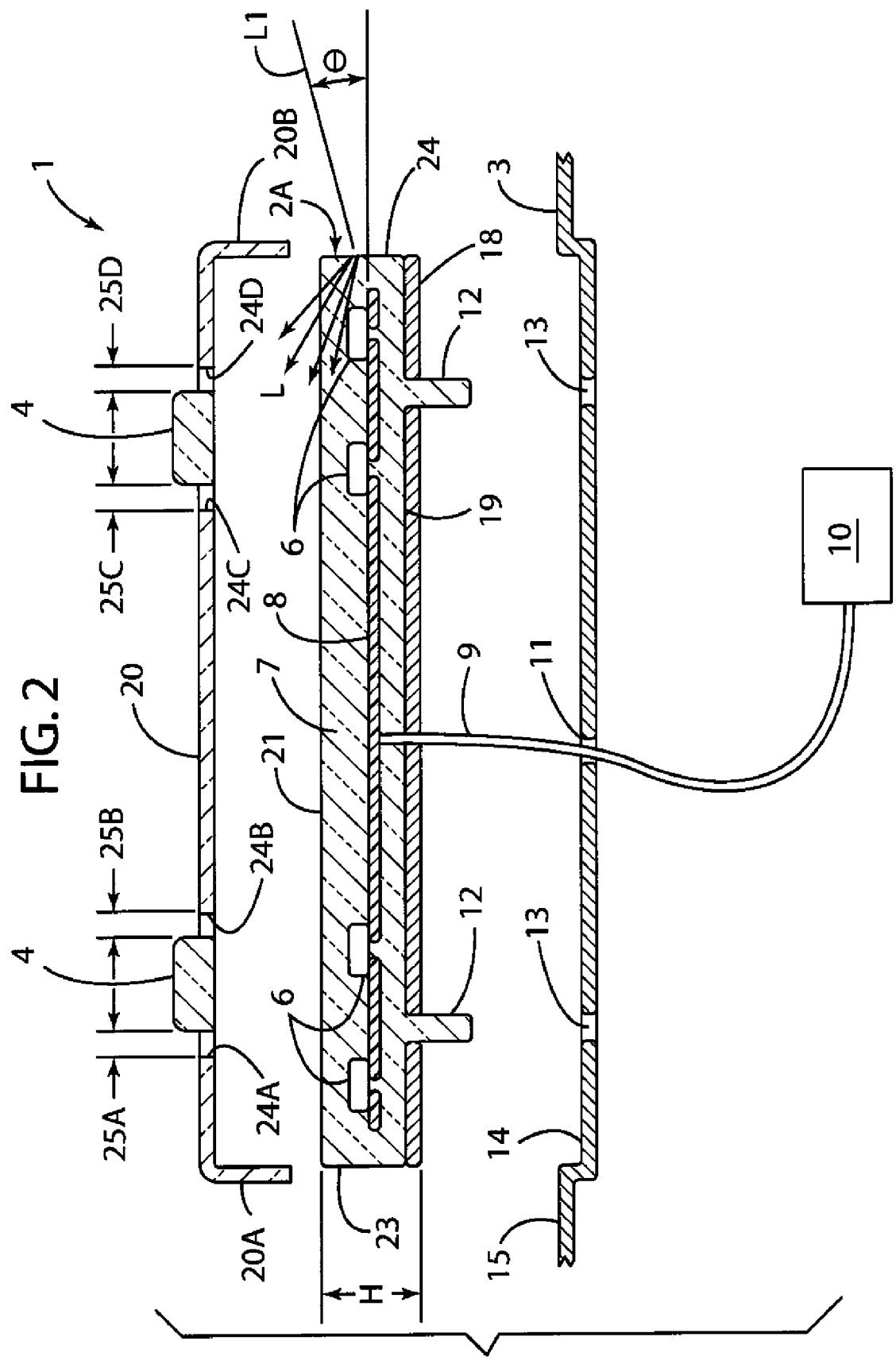
FIG. 2 is a fragmentary, partially exploded cross-sectional view taken along the line II-II.

For purposes of description herein, the terms "upper," "lower," "right," "left," "rear," "front," "vertical," "horizontal," and derivatives thereof shall relate to the invention as oriented in FIGS. 2-4. However, it is to be understood that the invention may assume various alternative orientations and step sequences, except where expressly specified to the contrary. It is also to be understood that the specific devices and processes illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
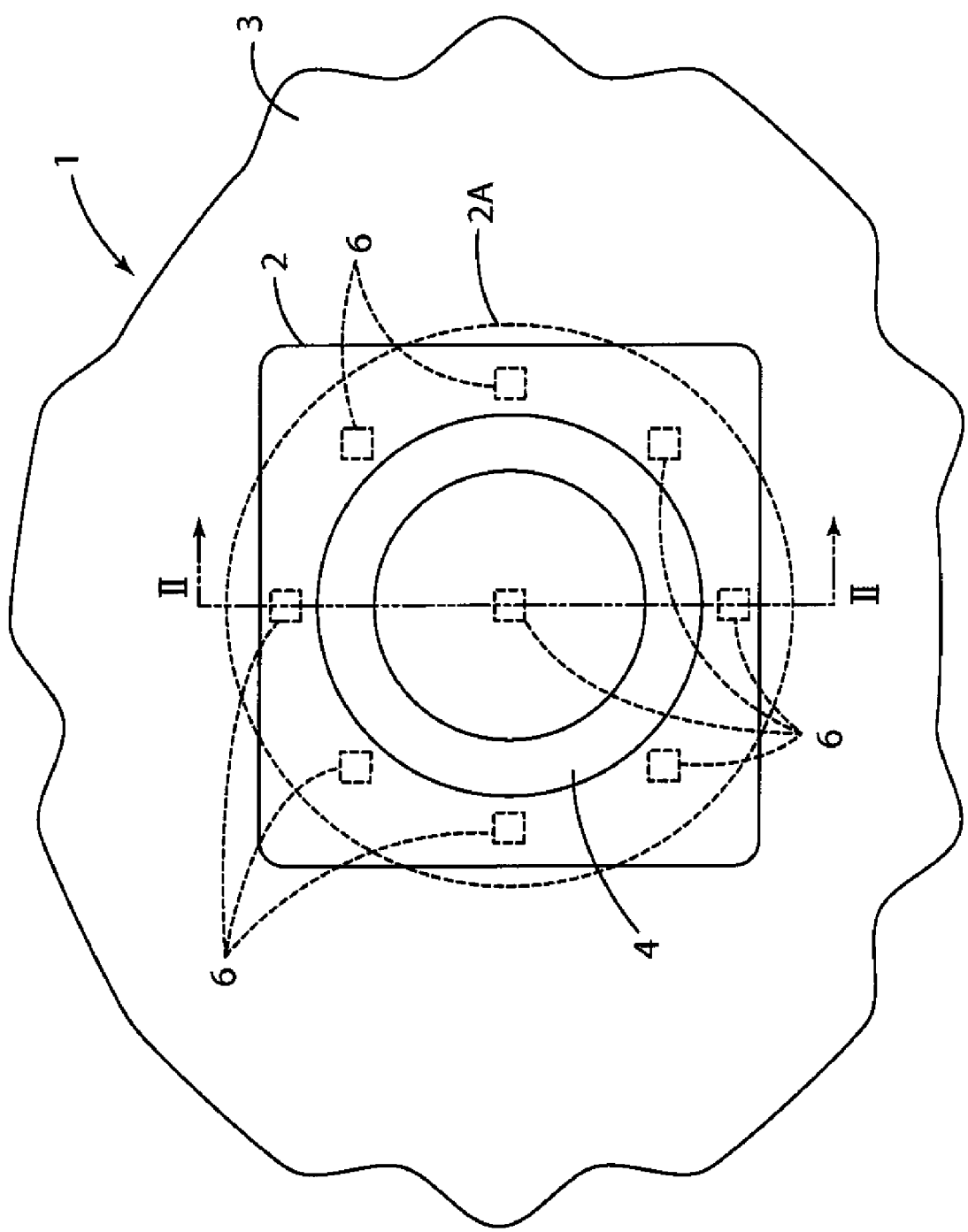
FIG. 1 is a partially fragmentary view of a badge or emblem installed to a vehicle or the like according to one aspect of the present invention.

With reference to FIG. 1, a lighted device such as a badge or emblem 1 according to one aspect of the present invention includes a base 2 that is secured to a structure 3, and an emblem or badge design 4. As discussed in more detail below, the structure 3 may be a sheet metal portion of a fender of a vehicle or the like, or it may comprise a back portion of a seat of a vehicle, or other mounting structure. In the illustrated example, the design 4 has a ring-like shape. It will be understood that the design 4 may comprise virtually any shape or design. In particular, the design 4 comprises a logo or trademark of an auto manufacturer or the like, such that the badge or emblem 1 readily identifies the make and/or model of the vehicle. Base 2 may be quadrilateral, or any other shape. For example, the base may be shaped to match or complement the shape of design 4 as shown by the dashed line 2A (FIG. 1). As also described in more detail below, the base 2 may include a plurality of LEDs 6 that provide for back lighting of the design 4.

With further reference to FIG. 2, a light device such as a badge or emblem 1 according to one aspect of the present invention includes a base 2A having a plurality of LEDs 6 embedded in light-transmitting polymer material 7. Polymer material 7 is preferably clear, but it may comprise a colored translucent material, or it may comprise other light-transmitting material. A conductor 8 embedded within the clear polymer material 7 supplies electrical power to the LEDs 6. One or more electrical power lines 9 are electrically connected to the conductor 8, and supply power from a power source 10. The electrical power lines 9 pass through an opening 11 in the structure 3. It will be understood that the power source 10 may include the necessary circuitry (not shown) to drive the LEDs 6 in addition to a conventional battery power source of the type utilized for vehicles and the like. Alternately, the circuit (not shown) for driving the LEDs may be positioned on conductor 8, and embedded in polymer material 7. The base 2A may be fabricated according to the arrangement disclosed in detail in U.S. Provisional Patent Application No. 60/838,982, entitled ELECTRICAL DEVICE HAVING BOARDLESS ELECTRICAL COMPONENT MOUNTING ARRANGEMENT, filed on Aug. 21, 2006, the entire contents of which are incorporated by reference.

The base 2A may include a pair of mounting/locating posts or bosses 12 formed from the clear polymer material 7. The posts or bosses 12 are received in openings 13 in structure 3 to locate the base 2A in the proper position on structure 3. The structure 3 may include an indentation or recessed area 14 that receives the base 2A to reduce the extent to which the badge or emblem 1 protrudes above the surface 15 of structure 3. It will be understood that the thickness or height "H" of the base 2A is typically quite small, in the range of about 3-6 mm. The thicknesses of the components of the base 2A are exaggerated in FIG. 2 for purposes of illustration. A layer of adhesive 18 on lower side 19 of base 2A secures the base 2A to the structure 3. In a preferred embodiment, the adhesive 18 is a pressure sensitive adhesive ("PSA"). However, other suitable adhesives or securing arrangements may also be utilized in accordance with the present invention.

The badge or emblem 1 of FIG. 2 includes a thin layer of material 20 that may be secured to a top surface 21 and to side surfaces 22 and 23 of clear polymer material 7. The thin layer of material 20 comprises film, paint, or other substantially opaque material that blocks light generated by LEDs 6. Layer 20 may be colored to provide the desired appearance for the badge or emblem 1. Edges 24A, 24B, 24C, and 24D of layer 20 are spaced apart from the material forming the design 4 to form gaps 25A, 25B, 25C, and 25D, respectively. The design 4 is preferably a solid member made of opaque plastic polymer, metal, or other suitable material that blocks light from LEDs 6 and provides the desired wear and appearance characteristics. The thin layer 20 and material of design 4 both block the light from the LEDs 6, such that the light can only escape through the gaps 25A-25D. This provides a unique edge lit arrangement that accents the design 4. In the illustrated example, the thin film 20 includes edge portions or flaps 20A and 20B that extend over the side surfaces 23 and 24, respectively, of the clear polymer material to thereby prevent escape of light from the LEDs 6 at the edge or side surface 23 and 24.

LEDs 6 are preferably side-emitting LEDs that would emit light sideways (e.g., parallel to conductor 8) if mounted flat on conductor 8. LEDs 6 are, however, preferably mounted to conductor 8 at an angle "θ" of about 30°. Also, LEDs 6 are oriented to emit light "L" towards side surfaces 23 and 24. Light L incident on side surfaces 23 and 24 is reflected inwardly back into polymer material 7. The line "L1" of FIG. 2 represents the path light from an LED 6 would travel if the light were not reflected intervally. Mounting LEDs 6 at an angle θ facilitates dispersion of the light from LEDs 6 within the polymer material 7 and avoids or reduces "hot spots" (areas of greater light intensity) that could otherwise be formed if the LEDs 6 were mounted in a flat configuration (i.e., θ=0°). Top surface 21 of polymer material 7 may be grained, frosted, or otherwise non-smooth to provide for dispersion (escape) of light from surface 21. Top surface 21 may have an irregular or rough surface in the areas of gaps 25A-25D to promote dispersion of light in these areas, and top surface 21 may be smooth in other areas to promote internal reflection of light L.

Because the LEDs 6 and conductors 8 are completely embedded within the clear polymer material 7, the badge or emblem 1 is completely or substantially waterproof, thereby providing a high degree of durability and weather resistance. Also, because the LEDs 6 draw a relatively low amount of electrical power, the badge or emblem 1 does not significantly effect the electrical power system of the vehicle. The badge or emblem 1 may be operably connected to a timer or the like that continues to light the LEDs 6 for a period of time after the vehicle ignition or other lights are turned off. In this way, a parked vehicle in a parking lot or the like having an emblem 1 will provide a unique lighted display of the badge or emblem even after the vehicle is turned off. Because the power requirements of the LEDs 6 are very low, the timer may be configured to leave the badge or emblem 1 on for a relatively long period of time, such as 10 minutes, 20 minutes, 30 minutes, or an hour or more. Thus, if the vehicle includes a timer that turns off the vehicle headlights and/or interior lights after a few minutes, the emblem 1 may remain illuminated for a substantially longer period of time.

With further reference to FIG. 3, a device such as a badge or emblem 1A according to another aspect of the present invention includes a base 2A having side-emitting LEDs 6 and a conductor 8 embedded in a clear polymer material 7 in substantially the same manner as illustrated in FIG. 2. LEDs 6 are mounted at an angle (i.e. not flat) as discussed above in connection with FIG. 2. However, unlike the badge or emblem 1 of FIG. 2, edges 31A, 31B, 31C and 31D of material 30 are positioned below the material forming the designs 4, such that no gap or the like is formed around the designs 4. Material 30 may be opaque paint, polymer, or other such material. With further reference to FIG. 3A, design 4 may comprise a light-transmitting or clear polymer material 26 with a thin layer of light-transmitting material 27 disposed over the polymer material 26. Layer 27 is a light-transmitting material that produces a chrome-like appearance when LEDs 6 are turned off. However, layer 27 transmits light and illuminates design 4 when LEDs 6 are turned on by transmitting light from LEDs 6 through layer 27. Layer 27 may be a LensLite® film that is commercially available from Craft Originators of Hamilton, Ontario, Canada. Layer 27 may comprise one or more layers of material as disclosed in U.S. Pat. No. 6,101,748, the entire contents of which are incorporated by reference. Alternately, layer 27 may comprise a light-transmitting layer that is translucent, a colored layer of polymer material or paint. Still further, layer 27 may be eliminated, and the polymer material 26 may comprise a colored translucent material providing a lighted design 4.

As discussed above, although the base 2 illustrated in FIG. 1 has a generally quadrilateral shape, the base of the badge or emblem 1 may be chosen to have a shape as shown by the dashed line designated 2A in FIG. 1 that complements the shape of the design 4. As also discussed above, the design 4 may have virtually any shape or configuration as required to properly identify the particular make or model of vehicle, or provide another desired decorative effect. Accordingly, the shapes illustrated in the present application for the design 4 and base 2 are merely for purposes of illustration to provide for understanding of the present invention, and are not to be construed to be limiting with respect to the shape of these components.

With further reference to FIG. 4, a badge or emblem 1B according to another aspect of the present invention includes one or more side-emitting LEDs 6 that are embedded in light-transmitting or clear polymer material 35. LEDs 6 are mounted at an angle (i.e. not flat) as discussed above in connection with FIG. 2. Electrical power is supplied to the LEDs 6 via a conductor 8. In addition to the clear polymer material 35, the badge or emblem 1B further includes a portion 36 made of a non-translucent polymer material such as a black ABS material. In the illustrated example, the portion 36 includes a main section 37 forming a layer adjacent the conductor 8, and upstanding edge or flange-like portions 38 and 39 that extend around the side surfaces 40 and 41, respectively of clear polymer material 35. Edge portions 38 and 39 prevent escape of light from LEDs 6 from the interfaces 40 and 41 formed where the non-translucent material 36 meets the clear polymer material 35.

Light from LEDs 6 is reflected inwardly at interfaces 40 and 41, and escapes through layers 50 embedded in a design or badge component 45. Design component 45 may be secured to a front surface 46 utilizing adhesive or the like (not shown) disposed on the lower surface 47 of the material forming the design 45. It will be understood that the design 45 may have a shape similar to the material forming design 4 of the badge or emblem 1 as illustrated in FIG. 1, or the material forming the design component 45 may have another shape as required for a particular application.

The badge or design 45 may have layers of material 50 embedded therein to form the design 4. More specifically, with reference to FIG. 5, the design or badge 45 may include a clear or translucent polymer body 51, with a thin layer of material 50 embedded in polymer body 51 to form logo or design 4. The layer of material 50 may be a LensLite® film described in aforementioned U.S. Pat. No. 6,101,748. It will be understood that the embossed layer 50 may actually comprise a plurality of layers as required to provide the desired effect. In a preferred embodiment, the layer 50 provides a chrome-like appearance when the design or badge 45 is viewed from the "A" surface. The layer 50 is embossed to provide a non-planar appearance. In the illustrated example, the layer 50 is embossed to a depth "H1" of about 1.5 mm, and the overall thickness "H2" of the badge 45 is about 3 mm. However, it will be understood that virtually any thickness may be utilized as required for a particular application. For example, layer 50 need not be embossed, and could comprise a flat layer or material. Clear or other light-transmitting polymer material 52 is disposed in the cavity 53 formed by the embossed layer 50. When light "L" from LEDs 6 is incident upon the clear polymer material 52, it is transmitted through the clear polymer material 52, the embossed layer 50, and through clear polymer material 51. The light L then escapes through outer surface 46 of polymer material 51.

First and second layers of paint or other opaque film 54 and 55 are disposed on the clear polymer material 51 in the areas surrounding the embossed layer 50 to block the transmission of light "L" from the LEDs 6. Layer 55 is preferably a layer of polymer material, black paint or the like that blocks the transmission of light. Layer 54 comprises a paint or other polymer layer that may be colored to provide the desired background color surrounding the chrome embossed layer 50. Pressure sensitive adhesive ("PSA") may be utilized to secure the design or badge 45 to the front side surface 46 of the clear polymer material 35 (FIG. 4) and the black polymer portion 36. Preferably, the PSA is not applied to the clear polymer material 52 so as not to block the transmission of light "L" through the embossed layer of material 50.

The light device or assembly/badge/emblem 1 of the present invention may be utilized on the exterior of vehicles, such as on a fender, bumper, or the like. Alternately, the light assembly I may be positioned, for example, on the back of a seat or the like. Still further, a light assembly 1 according to the present invention may be mounted to the exterior of a building, house, or other stationary structure to thereby provide for a decorative or informative effect.

With further reference to FIG. 6, a light assembly or device according to another aspect of the present invention comprises a vehicle component such as a doorsill assembly 60 having a primary structure 61 including an elongated flat portion 62, and an upwardly-extending channel portion 63. In use, a vehicle door (not shown) is positioned above the flat portion 62 of primary structure 61, and side surface 64 of channel portion 63 disposed directly adjacent, or in contact with, a lower edge portion (not shown) of the vehicle door. A light assembly 70 (see also FIG. 7) is mounted to the primary structure 61, and includes an upper surface 71 that is visible through an opening 66 in flat portion 62 of primary structure 61.

With reference to FIG. 7, light assembly 70 includes a light source/guide assembly 74, an upper member or appliqué 75 forming upper surface 71 a backing member 76, and an optional reflective layer or member 77.

The upper member 75 is made of a thin sheet of polycarbonate or other suitable polymer material having a thickness of about 1.0 mm to 2.0 mm. In the illustrated example, upper member 75 is about 1.5 mm thick. The upper member 75 may be made from a layer or sheet 80 of polymer material having light-transmitting properties, and ink 78 or other light-blocking material is applied to a lower surface 79 of the sheet of material 80, leaving areas 81 without ink 78, such that light from light source/guide assembly 74 may be transmitted through the areas 81. The areas 81 may form letters, designs, or the like. In particular, the areas 81 may form letters spelling out the brand or model of the vehicle that can be read by a user when the doors open to expose the lighted doorsill assembly 60 (FIG. 6). The areas 81 may also form designs or shapes other than letters, numbers, etc. The upper surface 71 of sheet 80 may comprise a protective coating of wear-resistant material to improve durability of the light assembly 70. One example of a suitable material for the coating or layer of surface 71 is SERIGLAZE® product available from Serigraph, Inc. of West Bend, Wis. The sheet 80 is preferably a clear or translucent material. In particular, the sheet 80 may comprise a white polymer material that provides sufficient light transmission capability to illuminate the areas 81, while simultaneously not permitting a user to view the light source/guide assembly 74 and/or vacuum member and reflective member 77 through the areas 81.

The light source/guide assembly 74 includes a light source 85 that is connected to a light guide 86 at a joint 87. Electrical lines 88 and 89 extend from the light source 86, and connect to a conventional 12 volt vehicle electrical power supply.

With further reference to FIG. 8, the light source/guide assembly 74 includes a light guide 86 and a light source assembly 85. The light guide 86 may be formed from a sheet of acrylic material or other suitable polymer having a relatively uniform thickness. The thickness of the light source 85 and light guide 86 will vary depending upon the requirements of a particular application. In the illustrated example, light source 85 and light guide 86 have a thickness in the range of about 2.0-4.0 mm, and more preferably about 3.0 mm. However, light source 85 and light guide 86 could have different thicknesses. In the illustrated example, the light guide 86 is cut from a large sheet of material to form a perimeter 91 including a recess such as inwardly-extending portion 92 with a surface 93 having a shape that closely corresponds to a protrusion 95 of light source assembly 85. The light guide 86 may be formed by laser-cutting, sawing, or otherwise cutting a sheet of polymer material. Alternately, the light guide 86 may be molded utilizing a suitable polymer material or the like. As described in more detail below, the light source assembly 85 includes one or more LEDs and other electrical components that are molded into polymer body 96. In the illustrated example, the light guide 86 comprises a rectangular prism, with the exception of the inwardly-extending portion 92. Light from the light source assembly 85 is reflected internally within the light guide 86, and subsequently escapes from the upper surface 97 and through the areas 81 (FIG. 7) of upper member 75.

The protrusion 95 of light source 85 is configured to be closely received within the recess or inwardly-extending portion 92 of perimeter 91 of light guide 86 to thereby mechanically and optically interconnect the light source assembly 85 and light guide 86. In the illustrated example, the protrusion 95 is generally T-shaped in plan view (FIG. 9), with a first portion 98, and transversely-extending portions 99 and 100. The inwardly-extending portion 92 of light guide 86 includes a first portion 101 corresponding to the first portion 98 of protrusion 95, and side portions 102 and 103 corresponding to transverse portions 99 and 100, respectively, of protrusion 95 of light source assembly 85. The protrusion 95 may be dimensioned slightly larger than the inwardly-extending portion 92 of perimeter 91 of light guide 86 to thereby form an interference fit to mechanically interconnect the light source assembly 85 to the light guide 86 without the use of adhesives. Adhesive material (not shown) may optionally be applied to the protrusion 95 and/or inwardly-extending portion 92 immediately prior to assembly to provide for secure connection between the light source assembly 85 and light guide 86. Also, to ensure that the light source assembly 85 is optically coupled to the light guide 86, a small amount of light-transmitting material such as a clear sealant or adhesive material may also be applied to the protrusion 95 and/or inwardly-extending portion 82 of perimeter 91 at the time of assembly.

With further reference to FIGS. 9-11, light guide 86 includes irregular surface portions 106 that form a dispersion pattern that causes light from the light source assembly 84 to be dispersed within light guide 86 towards upper surface 97 of light guide 86, such that the light escapes from upper surface 97 of light guide 86. In the illustrated example, the outline 107 of the dispersion pattern 106 is in the form of letters having a shape that is substantially similar to the light-transmitting areas 81 (FIG. 7) of upper member 75. The dispersion pattern 106 may have the same size and shape as areas 81, or it may be somewhat larger or smaller, In general, the dispersion pattern 106 may be somewhat larger than the areas 81 to ensure that the areas 81 are fully illuminated, and has a similar shape to provide for efficient dispersion of light adjacent light-transmitting areas 81 of upper member 75. In the illustrated example, the dispersion pattern 106 is formed on lower surface 105 of light guide 86 by a laser. The dispersion pattern 106 comprises a plurality of small surface irregularities such as low spots, high spots, or a combination of both, produced by a laser incident upon the lower surface 105. It will be understood that the boundary line 107 is provided for purposes of illustrating the outline of the dispersion pattern 106 relative to the adjacent smooth portions 108 of lower surface 105 of light guide 86, but the dispersion pattern does not necessarily include an actual line 107 formed on light guide 86.

Figure 12:
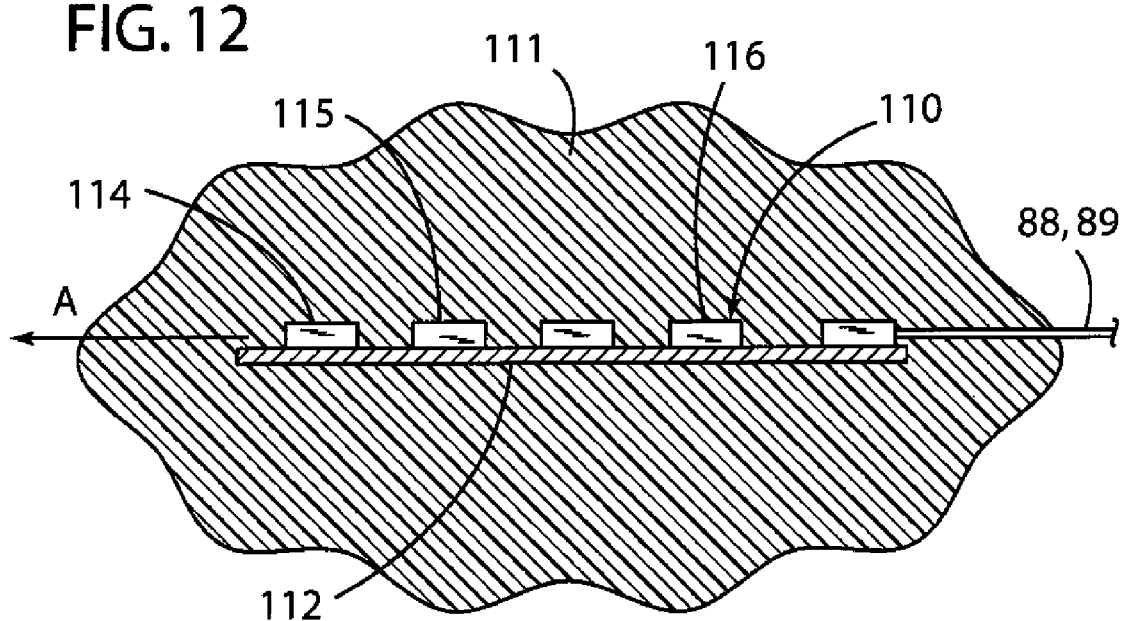
FIG. 12 is a fragmentary, enlarged view of a portion of the light source of FIG. 11 showing the internal electrical components.

With reference to FIG. 10, light source assembly 85 includes an internal electrical assembly 110 that is embedded in a polymer body 111. With further reference to FIG. 12, the electrical assembly 110 may include conductive circuit elements 112, and one or more electrical components 115, 116 such as resistors, diodes, capacitors, or the like that are soldered or otherwise electrically and/or mechanically connected to the circuit elements 112. In the illustrated example, the electrical components include a side-emitting LED 114 that is configured to emit light in the direction of the arrow "A", and one or more additional electrical components 115 and 116 that are also secured to the conductive elements 112. One or more conductive lines 88 and 89 supply power to the circuit elements 112, and extend outside of the polymer body 111. The side-emitting LED 114 and/or other electrical components 115, 116 may be secured to the circuit elements 112 and molded into the polymer body 111 according to the arrangement disclosed in U.S. patent application Ser. No. 11/842,606, entitled ELECTRICAL DEVICE HAVING BOARDLESS ELECTRICAL COMPONENT MOUNTING ARRANGEMENT, filed on Aug. 21, 2007, the entire contents of which are incorporated by reference.

Figure 13:
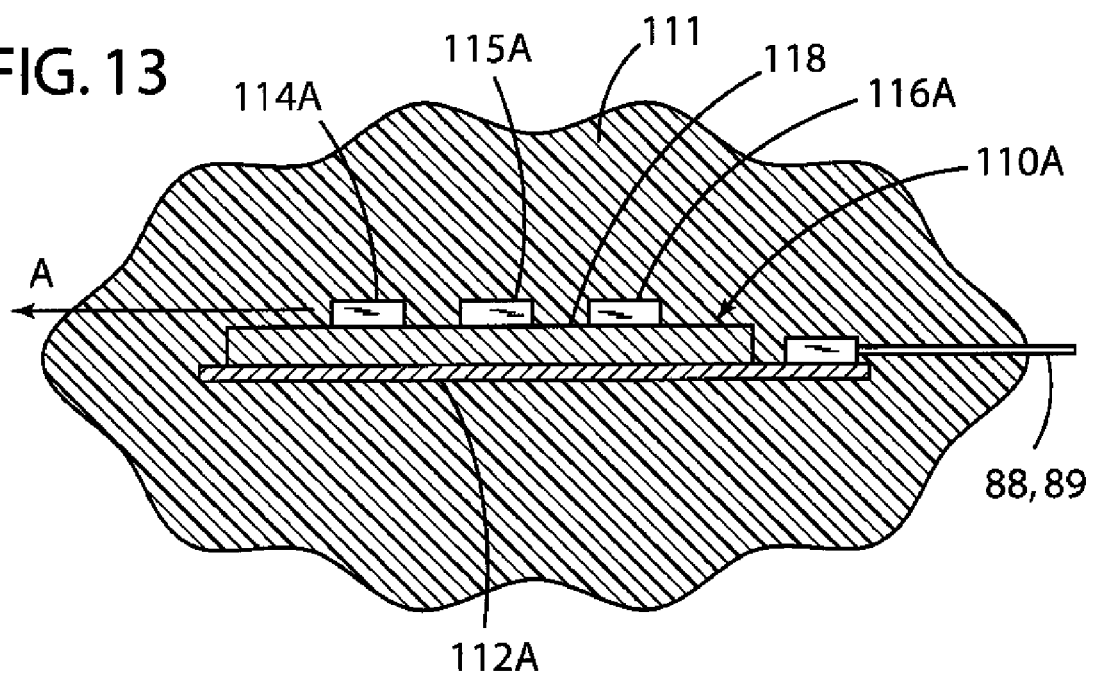
FIG. 13 is a fragmentary, cross-sectional view of a portion of a light source according to another aspect of the present invention.

With reference to FIG. 13, the light source assembly 85 may comprise an electrical assembly 110A having a printed circuit board 118 that is soldered or otherwise secured to circuit elements 112A, with a side-emitting LED 114A and other electrical components 115A and 116A being mounted to the printed circuit board 118. The electrical assembly 110A may be fabricated according to the arrangement disclosed in detail in U.S. Provisional Patent Application No. 61/013,097, entitled OVERMOLDED CIRCUIT BOARD AND METHOD, filed on Dec. 12, 2007, the entire contents of which are incorporated by reference. The LED 114A may comprise a red-green-blue ("RGB") LED configured to provide different colors as required for a particular application. Alternately, the RGB LED may be configured to change colors depending upon specific operating conditions (e.g. the ambient light level), such that the light assembly 70 (FIG. 6) provides a different color light under different operating conditions. The electrical components 115, 116 etc. are configured to drive the LED 114 (FIG. 12) or 114A (FIG. 13) when a conventional 12 volt D.C. power supply is connected to the lines 88 and 89. This permits the light assembly 70 to be connected to a conventional 12 volt vehicle power source (or other conventional power source). Although the light source 85 is illustrated as being supplied with power by electrical lines 88 and 89, it will be understood that the light source assembly 85 could be configured to include an electrical receptacle or the like to provide a plug-type connection as described in the above-identified application Ser. Nos. 11/842,606 and 61/013,097.

In the illustrated example, the LEDs 114/114A are positioned such that light from the LED 114 is generally transmitted/projected through the protrusion 95 (see also FIGS. 9 and 11) in the direction of the arrow "B". The light from the LED 114 is thereby transmitted into the light guide 86, such that the light is reflected internally until it escapes through the upper surface 97 of light guide 86. Alternately, the light source assembly 85 may include a pair of spaced-apart protrusions 95A and 95B (FIG. 9) that are received in corresponding inwardly-extending portions 92A and 92B, respectively, of light guide 86. If the light source 85 and light guide 86 are configured in this way, a flat surface 138 is formed on polymer body 111 of light source 85 that fits closely against a corresponding flat surface 139 on light guide 86, such that light from LED 114 is transmitted through the flat surfaces 138 and 139 of polymer body 111 and light guide 86, respectively.

Figure 14:
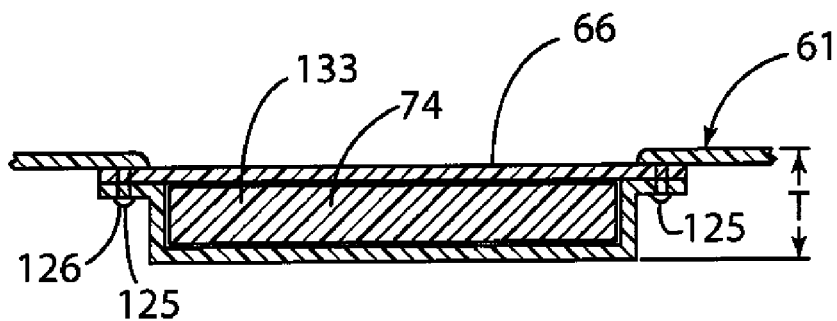
FIG. 14 is a fragmentary cross-sectional view of the lighted doorsill assembly of FIG. 6, taken along the line XIV-XIV.
Figure 15:
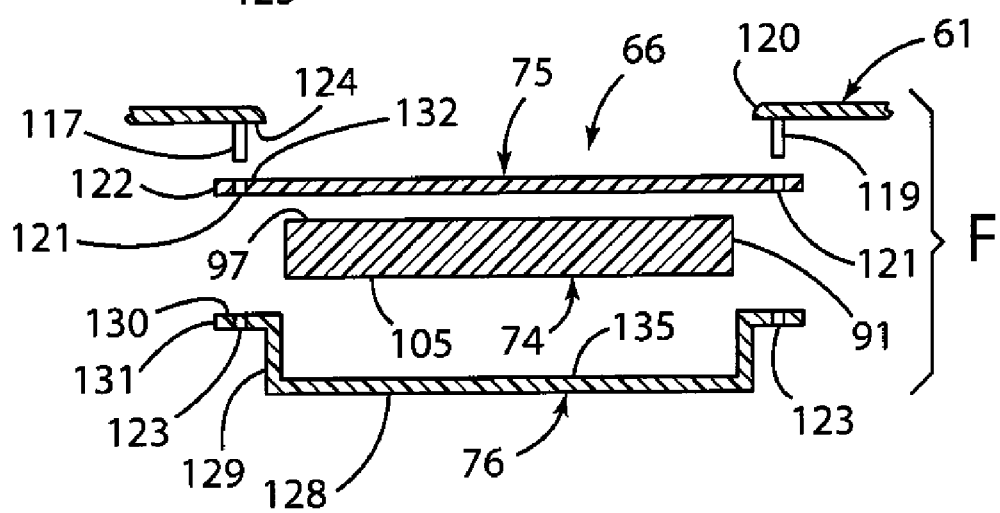
FIG. 15 is a fragmentary exploded view of the lighted doorsill assembly of FIG. 14.

With further reference to FIGS. 14 and 15, the primary structure 61 of lighted vehicle component or doorsill assembly 60 may be made of a polymer material, with posts 119 that extend downwardly adjacent edge 120 of opening 66. The upper member 75 includes a plurality of openings 121 adjacent the peripheral edge 122 of upper member 75, and backing member 76 includes a plurality of openings 123. During assembly, the posts 119 are inserted through the openings 121 of upper member 75, and through openings 123 of backing member 76, and the ends 125 (FIG. 14) of posts 119 are then melted to form an enlarged head or retainer portion 126 that physically interconnects the backing member 76 to the primary structure 61. The backing member 76 includes a main web 128, and a side wall or side web 129 that extends transverse relative to the base web 128. An outwardly extending flange portion 130 extends outwardly from the side web 129, and forms a peripheral edge 131. In the illustrated example, webs 128 and 129 have a thickness in the range of 0.10-0.20 mm and preferably about 0.15 mm. When the posts 119 of primary structure 61 are melted, the flange portion 130 of backing member 76 tightly clamps the outer edge portion 132 of upper member 75 between the flange 130 and the primary structure 61, thereby forming a water-tight seal. The primary structure 61, upper member 75, and backing member 76 together define a cavity 133, and the light source/guide assembly 74 is disposed within the cavity 133.

In addition to, or instead of, the posts 119, adhesive material, sealant, or the like may also be applied to the flange 130 of backing member 76, edge portions 132 of upper member 75, and/or edge surfaces 124 of primary structure 61 to adhesively interconnect the primary structure 61, upper member 75, and backing member 76 and/or to provide a water tight seal. In the illustrated example, the upper surface 97 and lower surface 105 of light source/guide assembly 74 are not adhesively connected to the upper member 75 or backing member 76, respectively. The perimeter surface 91 of light source/guide assembly 74 may also be free of adhesive material. Because the light source/guide assembly 74 is not adhesively bonded to these other components, the problems associated with light diffusion/degradation, or the like that could otherwise occur due to adhesively bonding the light source/guide assembly 74 to the other components is alleviated or eliminated.

The cavity 133 is thereby sealed to form a watertight cavity housing the light source/guide assembly. This provides an assembly that is durable and resistant to moisture-related degradation.

Figure 16:
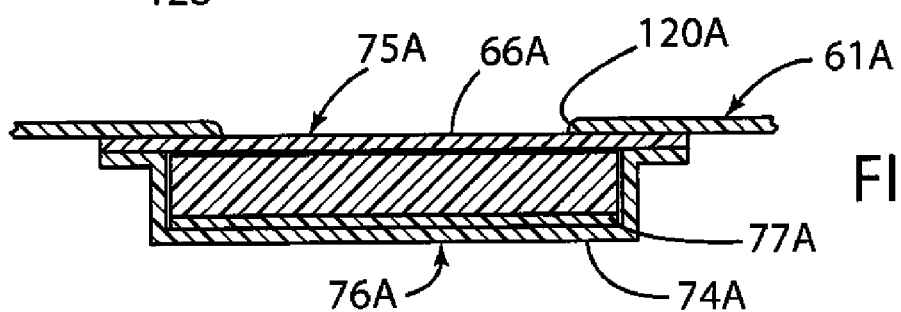
FIG. 16 is a cross-sectional view of another embodiment of the lighted doorsill assembly of FIG. 6.
Figure 17:
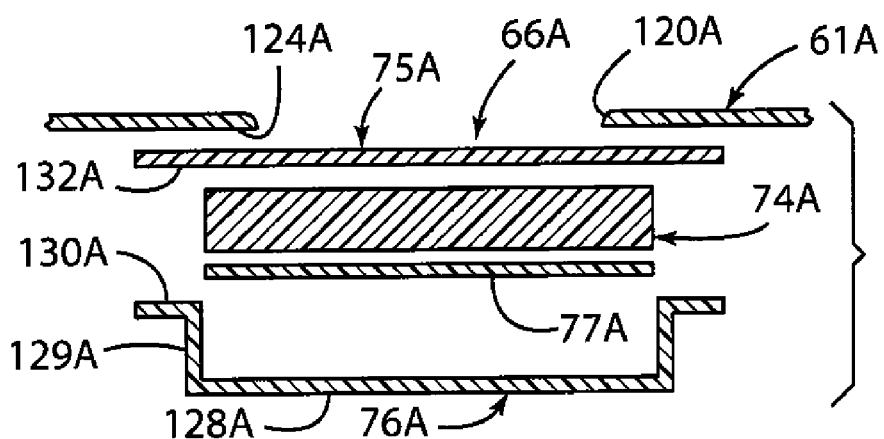
FIG. 17 is a fragmentary exploded view of the lighted doorsill assembly of FIG. 16.

In the illustrated example, the backing member 76 may be formed of an opaque polymer material that prevents escape of light from light source/guide assembly 74. Surface 135 of backing member 76 may comprise a layer of reflective material such as reflective ink, or a thin sheet of reflective material disposed on the main web 128 of backing member 76 to provide for increased reflection of light back into light guide 86 of light/guide assembly 74. With further reference to FIGS. 16 and 17, the light assembly may alternately comprise a backing member 76A having flange portions 130A that are adhesively bonded to edge portions 123A of upper member 75A. Similarly, the upper member 75A may be adhesively bonded to the edge surface portions 124A of primary structure 61A adjacent the peripheral edge 120 of opening 66A. A reflective member or layer 77A may be adhesively bonded to web 128A of backing member 76A to provide for increased reflection of light into light source/guide assembly 74A. The reflective member 77A may comprise a thin sheet of opaque polymer, such as a white polymer material having reflective qualities, and the backing member 76A may be made of an opaque, light-absorbing polymer material, such as a black polymer. The reflective member 77A may be adhesively bonded to the backing member 76A, or it may be integrally-formed with the backing member 76A utilizing an appropriate molding process.

In the illustrated example, the primary structure 61 has a thickness of about 1.0-2.0 mm, and preferably about 1.5 mm, in the vicinity of edge 120. Thus, in the illustrated example, the thickness "T" (FIG. 14) of the doorsill assembly 60 in the vicinity of light assembly 70 is about 5.0 mm. Also, in the illustrated example, light source/guide assembly 74 has a length "L" (FIG. 11) of about 40-50 mm, and a width "W" of about 15-25 mm. The main portion of body 111 of light source 85 is about 16-20 mm by 16-20 mm, and more specifically about 18 mm by about 18 mm (not including T-shaped protrusion 95).

In the foregoing description, it will be readily appreciated by those skilled in the art that modifications may be made to the invention without departing from the concepts disclosed herein. Such modifications are to be considered as included in the following claims, unless these claims by their language expressly state otherwise. Unless expressly stated otherwise, features of one embodiment or version of the present application are not mutually exclusive with respect to other embodiments or versions of the invention.

The invention claimed is:

1. A light assembly for vehicles, comprising:
a vehicle component configured to form a portion of a motor vehicle;
an outer member defining opposed inner and outer surfaces, the outer member comprising a sheet of material having a first area that transmits at least a substantial portion of light incident on the sheet through the sheet, and a second area that transmits substantially less light relative to the first area, such that the first and second areas together define a predetermined pattern;
a light guide disposed adjacent the inner surface of the outer member, the light guide defining a light-receiving portion, wherein the light guide is made of a light-transmitting material that internally reflects a substantial portion of light introduced into the light guide at the light-receiving portion;
a light source mechanically connected to the light guide adjacent the light-receiving portion, the light source including an electrically conductive circuit and at least one LED connected to the circuit, the light source further including a thermoplastic polymer body encapsulating the one LED and at least a substantial portion of the circuit;
a base member fixed to the outer member to define therewith a watertight cavity, and wherein the light guide and the light source are disposed within the watertight cavity.

2. The light assembly of claim 1, wherein:
the outer member comprises a sheet of material having a substantially uniform thickness.

3. The light assembly of claim 2, wherein:
the inner and outer surfaces of the outer member are substantially planar.

4. The light assembly of claim 3, wherein:
the outer member has a thickness of about 1.0-2.0 mm.

5. The light assembly of claim 4, wherein:
the outer member comprises a layer of polymer material.

6. The light assembly of claim 1, wherein:
the base member comprises a substantially planar inner surface; and
the light guide comprises a sheet of polymer material having substantially planar first and second opposed surfaces disposed adjacent the inner surface of the outer member and the inner surface of the base member, respectively.

7. The light assembly of claim 6, wherein:
the first and second surfaces of the light guide are in direct contact with the inner surface of the outer member and the inner surface of the base member, respectively.

8. The light assembly of claim 6, wherein:
the light guide has a thickness of about 2.0 mm to about 5.0 mm.

9. The light assembly of claim 1, wherein:
the light guide includes a body portion and an integrally-formed first connector; and wherein:
the thermoplastic polymer body of the light source includes an integrally-formed second connector engaging the first connector and mechanically interconnecting the light guide and the light source.

10. The light assembly of claim 9, wherein:
a selected one of the first and second connectors comprises a protrusion, and the other of the first and second connectors comprises an indentation, and wherein the protrusion is received in the indentation.

11. The light assembly of claim 10, wherein:
the protrusion includes a first portion extending in a first direction, and a second portion extending in a second direction that is transverse to the first direction.

12. The light assembly of claim 11, wherein:
the protrusion is T-shaped.

13. The light assembly of claim 12, wherein:
the protrusion includes planar opposite side surfaces, and a peripheral edge surface extending between the opposite side surfaces, and wherein the peripheral edge surface is perpendicular to the opposite side surfaces.

14. The light assembly of claim 1, wherein:
the base member defines a peripheral outer edge; and the outer member defines a peripheral outer edge that is about the same size and shape as the peripheral outer edge of the base member.

15. The light assembly of claim 14, wherein:
the base member defines a generally planar outer surface, the outer surface of the base member and the outer surface of the outer member defining a thickness that is less than about 5.0 mm.

16. The light assembly of claim 15, wherein:
the vehicle component includes a generally planar web portion having an opening therethrough, and wherein:
the outer member extends across said opening.

17. The light assembly of claim 16, wherein:
the web portion of the vehicle component comprises an upper surface portion adjacent a peripheral edge of the opening, and wherein:
the upper surfaces of the vehicle component and the outer surface of the base member define a dimension therebetween of about 5.0 mm or less.

18. The light assembly of claim 1, wherein:
the light guide comprises a sheet of polymer material defining a first thickness; and wherein:
the body of the light source includes upper and lower side faces defining a second thickness therebetween that is approximately the same as the first thickness.

19. The light assembly of claim 1, wherein:
the light guide and the polymer body of the light source both comprise and acrylic polymer material.

20. The light assembly of claim 1, wherein:
the base member comprises a central web having a peripheral edge, and a side wall extending transverse relative to the central web about the peripheral edge, and a flange extending transverse to the side wall, and wherein the flange is sealed to the vehicle component and forms a watertight joint between the vehicle component and the base member.

21. The light assembly of claim 20, wherein:
the central web has a substantially uniform thickness with generally planar upper and lower surfaces.

22. The light assembly of claim 20, wherein:
the central web defines an inner side, and includes:
a layer of reflective material disposed on the inner side of the central web.

23. The light assembly of claim 22, wherein:
the layer of reflective material comprises a first material defining a first reflectivity; and
the central web further comprises a second material defining a second reflectivity that is substantially lower than the first reflectivity.

24. The light assembly of claim 23, wherein:
the side wall and the flange are made of the second material.

25. A method of fabricating a lighting device, the method comprising the steps of:
providing an electrically-powered light source having a first connector;
providing a sheet of light-transmitting material having generally smooth opposite side surfaces that internally reflect light introduced into the sheet;
cutting the sheet to form a light guide having a peripheral edge and including a second connector; and:
engaging the first and second connectors to connect the light source to the light guide.

26. The method of claim 25, wherein:
the sheet of light is cut utilizing a laser.

27. The method of claim 26, wherein:
providing an electrically-powered light source includes:
providing an electrical circuit element:
securing an LED to the electrical circuit element; and
encapsulating the LED and at least a portion of the electrical circuit element in a thermoplastic polymer material.

28. The method of claim 27, wherein:
engaging the first and second connectors includes causing the first and second connectors to slidably contact one another.

29. The method of claim 28, wherein:
the step of cutting the sheet includes forming one of a protrusion and a recess in the peripheral edge of the sheet; and wherein:
encapsulating the LED includes forming a body surrounding the LED including the other of a protrusion and a recess.

30. The method of claim 25, including:
forming a plurality of surface irregularities on one of the opposite side surfaces of the light guide utilizing a laser.

31. The method of claim 30, wherein:
the surface irregularities form a predefined pattern.

32. The method of claim 25, including:
providing a base member defining a cavity; and:
positioning the light source and light guide in the cavity.

33. The method of claim 32, wherein:
the light source is connected to the light guide before the light source and the light guide are positioned in the cavity.

34. The method of claim 32, including:
providing a cover member; and:
sealing the cover member and the base member together such that the cavity is watertight.

35. The method of claim 34, wherein:
the cover member comprises a sheet of light-transmitting material having first and second opposite side surfaces; and including:
applying a layer of light-blocking material to portions of the first side surface to form a predefined pattern that is illuminated by the light source.

36. The method of claim 25, wherein:
the first connector is one of a protrusion and recess; and wherein:
cutting the sheet includes forming the other of a recess and a protrusion in the peripheral edge of the sheet.

37. The method of claim 36, wherein:
the first connector comprises a T-shaped protrusion; and
cutting the sheet includes forming a T-shaped recess in the peripheral edge of the sheet.

38. The method of claim 25, wherein:
providing an electrically-powered light source includes molding a thermoplastic body around at least one LED to encapsulate the LED within the thermoplastic body.

39. The method of claim 38, wherein:
the thermoplastic body is molded to include a pair of T-shaped protrusions;
a pair of corresponding T-shaped recesses are formed in the peripheral edge of the light guide.

40. The method of claim 39, wherein:
the light guide and the light source have substantially similar cross-sectional shapes.

41. A light assembly, comprising:
an electrically conductive circuit;
a plurality of LEDs mounted to the circuit;
a light-transmitting thermoplastic polymer body encapsulating the LEDs and at least a portion of the circuit and defining inner and outer side faces, wherein the polymer body includes smooth surface portions configured to internally reflect light from the LEDs, and irregular surface portions that disperse light from the LEDs such that the light from the LEDs escapes from the polymer body;

a layer of substantially opaque material disposed on the outer side face of the polymer body and covering selected portions of the outer side face and substantially blocking escape of light from the polymer body at the selected portions, the layer of substantially opaque material defining open areas on the outer side face of the polymer body, wherein the open areas are illuminated by light from the LEDs and form a lighted pattern.

42. The light assembly of claim 41, wherein:

the open areas are formed by openings through the layer of substantially opaque material.

43. The light assembly of claim 42, including:

at least one opaque member disposed in a selected one of the openings through the layer of substantially opaque material and defining a gap between the opaque member and the edge of the one opening through which light can escape.

44. The light assembly of claim 42, including:

a light-transmitting member extending over at least one of the openings and closing off the opening.

45. The light assembly of claim 44, wherein:

the light-transmitting member includes a polymer body portion and a layer of light-transmitting material disposed on the body portion, wherein the layer of light-transmitting material has an appearance that is substantially similar to chrome when the LEDs are turned off.

46. The light assembly of claim 41, including:

a timer that turns off the LEDs after a preselected period of time.

* * * * *